(12) United States Patent
Kushima et al.

(10) Patent No.: US 7,763,528 B2
(45) Date of Patent: Jul. 27, 2010

(54) METHOD FOR MANUFACTURING SEMICONDUCTOR DEVICE

(75) Inventors: Yoshimasa Kushima, Yamanashi (JP); Tadashi Yamaguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 947 days.

(21) Appl. No.: 11/330,996

(22) Filed: Jan. 13, 2006

(65) Prior Publication Data

US 2006/0154447 A1 Jul. 13, 2006

(30) Foreign Application Priority Data

Jan. 13, 2005 (JP) .............................. 2005-006779

(51) Int. Cl.
*H01L 21/00* (2006.01)

(52) U.S. Cl. ................ 438/465; 438/114; 257/E21.599

(58) Field of Classification Search ................ 438/465, 438/114; 257/E21.599
See application file for complete search history.

(56) References Cited

U.S. PATENT DOCUMENTS

| | | | | |
|---|---|---|---|---|
| 4,904,610 A | * | 2/1990 | Shyr | 438/463 |
| 5,930,599 A | * | 7/1999 | Fujimoto et al. | 438/113 |
| 6,077,757 A | * | 6/2000 | Mizuno et al. | 438/465 |
| 6,107,164 A | * | 8/2000 | Ohuchi | 438/465 |
| 6,534,387 B1 | * | 3/2003 | Shinogi et al. | 438/465 |
| 6,794,273 B2 | * | 9/2004 | Saito et al. | 438/462 |
| 7,023,027 B2 | * | 4/2006 | Teramae et al. | 257/620 |
| 7,064,010 B2 | * | 6/2006 | Farnworth et al. | 438/465 |

FOREIGN PATENT DOCUMENTS

| | | |
|---|---|---|
| JP | 11-214434 | 8/1999 |
| JP | 11-251493 | 9/1999 |
| JP | 2000-068401 | 3/2000 |
| JP | 2000-260910 | 9/2000 |

* cited by examiner

*Primary Examiner*—W. David Coleman
*Assistant Examiner*—Sun M Kim
(74) *Attorney, Agent, or Firm*—Volentine & Whitt, P.L.L.C.

(57) ABSTRACT

A method for manufacturing a semiconductor device includes forming protruded electrodes on a plurality of chip areas of a semiconductor wafer having the chip areas and boundary regions both being provided in a surface of the semiconductor wafer; forming a surface-side protective member so as to cover the surface of the semiconductor wafer and the protruded electrodes removing the semiconductor wafer corresponding to the boundary regions and forming trenches which expose the surface-side protective member; forming a back-side protective member with which the trenches are filled and which covers the back of the semiconductor wafer; and dividing the semiconductor wafer in the boundary regions with widths thinner than those of the trenches in such a manner that the surface-side protective member and the back-side protective member charged into the trenches are left in cut sections.

12 Claims, 9 Drawing Sheets

METHOD FOR MANUFACTURING SEMICONDUCTOR DEVICE

FIELD OF THE INVENTION

The present invention relates to a method for manufacturing a semiconductor device of a chip size package (also called a chip scale package, which will hereinafter be called "CSP") type assembled in a package substantially identical in dimension to a semiconductor chip.

BACKGROUND OF THE INVENTION

There has recently been a strong demand for reductions in the size and thickness of an integrated circuit package in which semiconductor integrated circuits have been packaged. In response to such a demand, a CSP type semiconductor device is known wherein external connecting solder bumps are provided within a semiconductor chip size to attain its size reduction.

In the CSP type semiconductor device, however, there have been known so-called chipping problems that when a semiconductor wafer is divided into fractions or pieces, a semiconductor substrate is get chipped, and the semiconductor substrate is chipped upon handling of the semiconductor wafer subsequent to being divided into the pieces and completed as each of the semiconductor devices (the former will hereinafter be called "chipping at division" and the latter will hereinafter be called "chipping subsequent to completion of each semiconductor device").

That is, in the CSP type semiconductor device divided as each piece from the semiconductor wafer after the surface of the semiconductor wafer has been resin-sealed, unlike a conventional semiconductor device resin-sealed after a semiconductor wafer has been divided into pieces, the semiconductor substrate is exposed even after the semiconductor wafer is divided into the pieces and completed as the semiconductor devices. Therefore, chipping is visually recognized even after the completion of the semiconductor device when the chipping occurs in the semiconductor substrate (around the outer edge portion of the back in particular) even at the division, thus reducing yields. Even though a semiconductor device that carries out a desired function is adopted, a product whose semiconductor substrate is chipped is bad in appearance and cannot hence be sold.

There was a possibility that even though chipping would not occur upon division, the chipping would occur in the exposed semiconductor substrate upon handling of the semiconductor device subsequent to its completion. There was particularly a high possibility that chipping would occur around the outer edge portion of the back of the exposed semiconductor substrate.

Such a solving means as shown in Japanese Patent Application Laid-Open No. 2000-260910 (patent document 1) is known to cope with such problems. That is, it is a method for forming trenches in the surface of a semiconductor wafer, sealing the surface thereof including the trenches with a resin and thereafter dividing the semiconductor wafer into pieces using a dicing blade having a thickness thinner than the width of each trench (refer to FIG. 2 in the patent document 1). According to this method, the time necessary for the dicing blade used for division to directly contact the semiconductor substrate can be less reduced because the dicing blade is not brought into direct contact with the surface of the semiconductor wafer on which stress is most applied upon its cutting but directly contacts the semiconductor substrate from the bottom of each trench. It is therefore possible to reduce a possibility that chipping at the division will occur. There is also a possibility that chipping will occur upon formation of each trench even according to this method. Since, however, the resin is charged into portions chipped with subsequent resin sealing even if the chipping occur upon trench formation, the chipping is prevented from occurring (refer to paragraphs 0014 to 0023 in the patent document 1).

Such a solving means as shown in Japanese Patent Application Laid-Open No. Hei 11(1999)-251493 (patent document 2) is next known. That is, it is a method for forming trenches in the surface and back of a semiconductor wafer respectively, sealing the surface and back thereof with a resin and thereafter dividing the semiconductor wafer into pieces using a dicing blade having a thickness thinner than the width of each trench (refer to FIGS. 37 and 36 in the patent document 2). According to the present method, since the back of a semiconductor substrate is also sealed with the resin, a possibility that chipping at the handling of a semiconductor device subsequent to its completion will occur can be reduced in addition to the advantage obtained by the method described in the patent document 1.

Next, there is known such a solving means as shown in Japanese Patent Application Laid-Open No. 2000-68401 (patent document 3). That is, it is a method for forming trenches in the surface of a semiconductor wafer and sealing the surface thereof including the trenches with a resin, and thereafter grinding the semiconductor wafer from its back to expose the trenches from its back and dividing the semiconductor wafer into pieces using a dicing blade having a thickness thinner than the width of each trench (refer to FIGS. 3 and 4 in the patent document 3). According to the present method, a possibility that chipping at the division will occur can be reduced because the dicing blade is not brought into direct contact with a semiconductor substrate upon division of the semiconductor wafer into the pieces. Since the outer peripheral portion of the back where the chipping is most likely to occur, is covered with the resin, a possibility that chipping subsequent to the completion of a semiconductor device will occur can also be reduced.

Next, there is known such a solving means as shown in Japanese Patent Application Laid-Open No. Hei 11(1999)-214434. That is, it is a method for forming trenches in the surface of a semiconductor wafer, sealing the surface thereof including the trenches with a resin, grinding the semiconductor wafer from the back of the semiconductor wafer to expose the trenches from the back thereof, and next sealing the back thereof with the resin and dividing the semiconductor wafer into pieces using a dicing blade thinner than the width of each trench (refer to FIGS. 2 and 3 in the patent document 4). According to the present method, a possibility that chipping at the division will occur can be reduced because the dicing blade is not brought into direct contact with a semiconductor substrate upon division of the semiconductor wafer into the pieces. Since the semiconductor substrate is completely covered with the resin inclusive of the back of the semiconductor substrate, it is also possible to reduce a possibility that chipping subsequent to the completion of a semiconductor device will occur.

Since, however, the semiconductor substrate (the outer edge portion of the back in particular) is exposed even after the completion of the semiconductor device according to the method described in the patent document 1, the possibility that the chipping at the handing of the semiconductor device subsequent to its completion will occur has been still left. Since the dicing blade is brought into direct contact with the semiconductor substrate upon division of the semiconductor wafer into the pieces although its contact is short in time, it cannot be said that the present method brings about complete countermeasures against the chipping at the division.

Since the dicing blade is brought into direct contact with the semiconductor substrate upon division of the semiconductor wafer into the pieces although its contact is short in time, it cannot be said that even the method described in the patent document 2 brings about complete countermeasures against the chipping at the division.

Next, the method described in the patent document 3 has a problem in that since it is necessary to provide a step for grinding the semiconductor wafer from the back thereof to expose the trenches, the number of process steps increases.

The method described in the patent document 4 has a problem in that since a step for grinding the semiconductor wafer from the back thereof to expose the trenches is needed, the number of process steps increases.

SUMMARY OF THE INVENTION

It is therefore an object of the present invention to provide a method for manufacturing a CSP type semiconductor device capable of reducing the possibility of occurrence of chipping at division and chipping subsequent to the completion of a semiconductor device without increasing the number of process steps to the utmost.

According to one aspect of the present invention, for achieving the above object, there is provided a method for manufacturing a semiconductor device, comprising the steps of forming protruded electrodes on a plurality chip areas of a semiconductor wafer having the plurality of chip areas and boundary regions formed among the chip areas, both being provided in a surface of the semiconductor wafer, forming a surface-side protective member so as to cover the surface of the semiconductor wafer and the protruded electrodes, removing the semiconductor wafer corresponding to the boundary regions and forming trenches which expose the surface-side protective member, forming a back-side protective member with which the trenches are filled and which covers the back of the semiconductor wafer, and dividing the semiconductor wafer in the boundary regions with widths thinner than those of the trenches in such a manner that the surface-side protective member and the back-side protective member charged into the trenches are left in cut sections.

According to the present invention, the possibility that chipping at division and chipping subsequent to the completion of a semiconductor device will occur can be reduced without increasing the number of process steps as compared with the related art.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the shape, size and physical relationship of each constituent element in the figures are merely approximate illustrations to enable an understanding of the present invention and by no means limitative of the invention in particular.

First Preferred Embodiment

Figure 1:
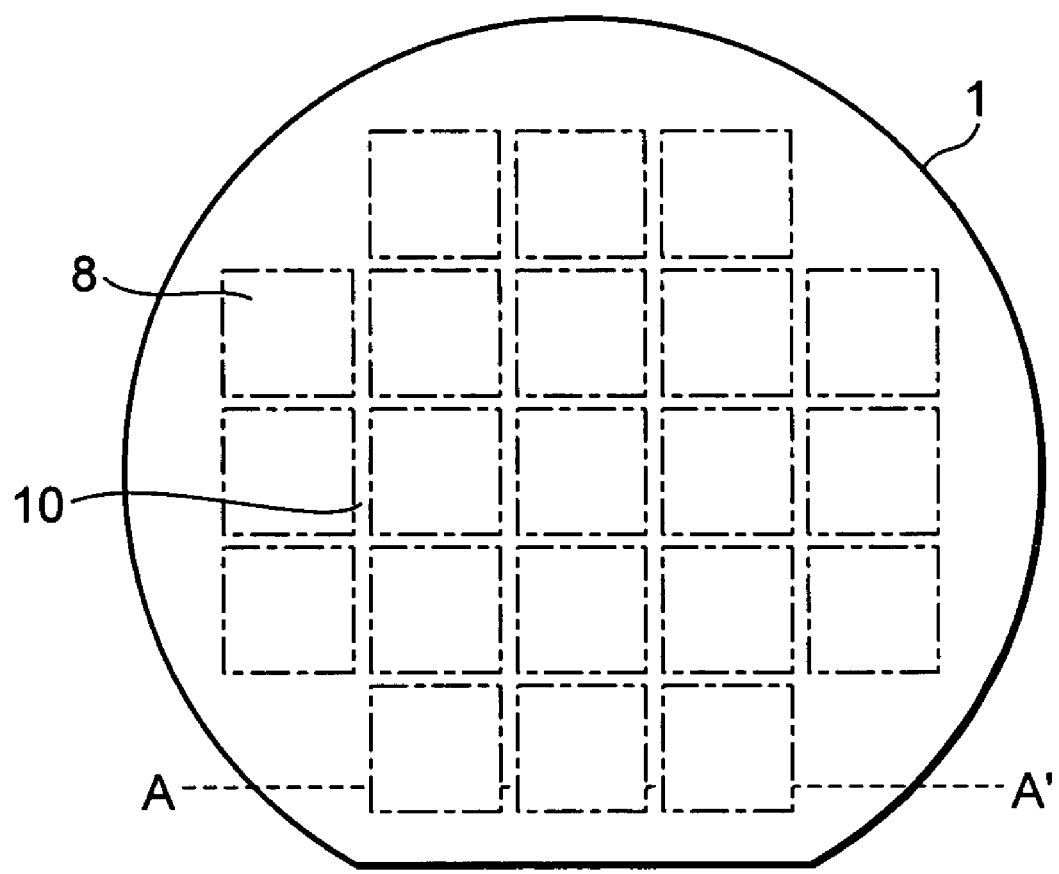
FIG. 1 is a plan view showing the surface of a semiconductor wafer.
Figure 3:
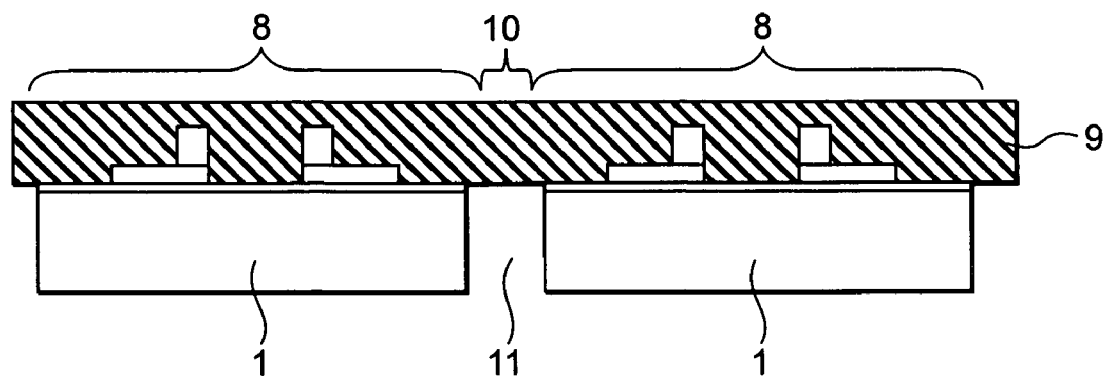
FIG. 3 is an enlarged view of a sectional view showing a trench forming process step.
Figure 4:
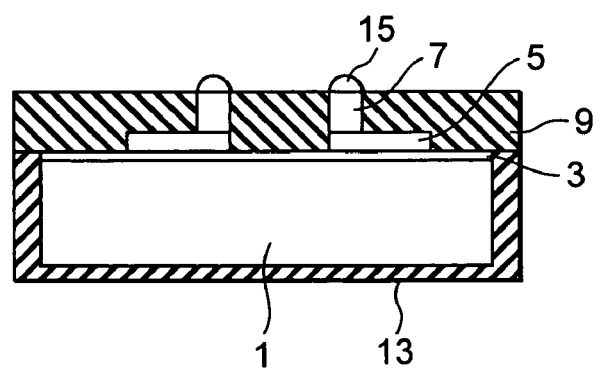
FIG. 4 is a sectional view of a semiconductor device manufactured by the manufacturing method according to the first embodiment.

A method for manufacturing a semiconductor device, according to a first embodiment of the present invention will be explained using FIGS. 1 through 4. FIG. 1 is a plan view of a semiconductor wafer of the present embodiment, and FIGS. 2(A) through 2(F) are respectively sections taken every manufacturing process steps in the present embodiment and sectional views each showing a portion taken along line A-A' of FIG. 1. FIG. 3 is a view showing, in an enlarged form, a sectional view illustrating a trench forming process step [process step 1-3]. FIG. 4 is a sectional view of a semiconductor device manufactured by the manufacturing method of the present embodiment.

Figure 2A:
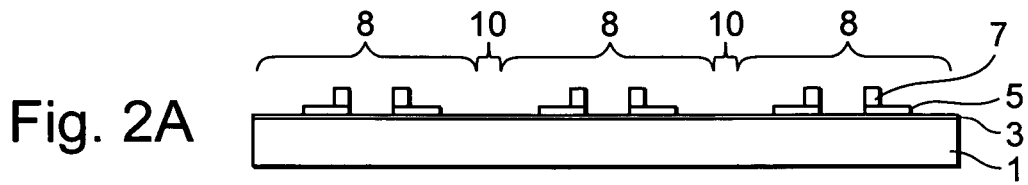
FIG. 2 illustrates sectional views taken every process steps for describing a manufacturing method according to a first embodiment.

[Process Step 1-1] Protruded Electrode Forming Step:

As shown in FIGS. 1 and 2(A), posts 7 (protruded electrodes) are first respectively formed on a plurality of chip areas 8 of a semiconductor wafer 1 having the plurality of chip areas 8 and boundary regions 10 formed among the chip areas 8 both of which are provided in the surface of the semiconductor wafer 1. That is, the semiconductor wafer 1 having the plurality of chip areas 8 and the boundary regions 10 on its surface is prepared (see FIG. 1), and semiconductor integrated circuits (not shown) are formed in the individual chip areas 8 respectively. The surface of the semiconductor wafer 1 including the semiconductor integrated circuits is covered with an insulating film 3. Redistribution traces 5 electrically connected to the individual semiconductor integrated circuits are formed on the insulating film 3, and the posts 7 are respectively formed on the redistribution traces 5 (see FIG. 2(A)).

Here, for example, a silicon oxide film ($SiO_2$), Phospho-Silicate-Glass (PSG), a silicon nitride film ($Si_3N_4$), and a polyimide resin (PI) can be used as the insulating film 3. Aluminum can be used as the redistribution traces 5, and copper can be used as the posts 7.

The thickness of the semiconductor wafer 1 is set to 310 µm, one side of each individual chip area 8 is set to 5 mm, and the width of each boundary region 10 is set to 60 µm.

Figure 2B:
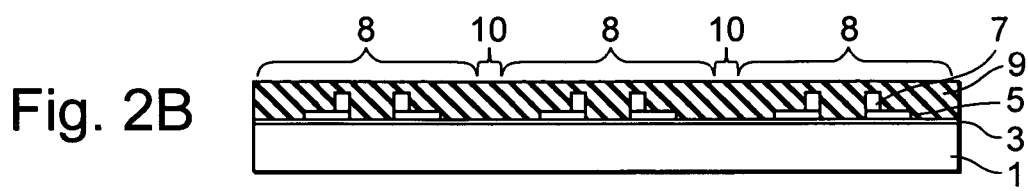

[Process Step 1-2] Surface-Side Protective Member Forming Step:

Next, as shown in FIG. 2(B), a surface-side protective member 9 is formed so as to cover the surface of the semiconductor wafer 1 and the posts 7. That is, the insulating film 3 for covering the surface of the semiconductor wafer 1, the redistribution traces 5 and the posts 7 are covered with the surface-side protective member 9.

Resins such as polyimide, epoxy, polybenzoxazole (PBO), benzocyclobutene (BCB), etc. can be used as a material for the surface-side protective member 9.

The surface-side protective member 9 is formed as shown in FIG. 7. That is, a solid and resinous tablet 24 is placed on the surface of the semiconductor wafer 1 mounted on a heated lower die 20 (see FIG. 7(A)). A heated upper die 22 is lowered (see FIG. 7(B)) to make contact with the tablet 24, thereby press-spreading the tablet over the surface of the semiconductor wafer 1 while melting the tablet with heat in gel or liquid form (see FIG. 7(C)). The tablet is further press-spread substantially over the entire surface of the semiconductor wafer 1 (see FIG. 7(D)). Then, the tablet is cooled and solidified, whereby the surface-side protective member 9 can be formed. The thickness of the surface-side protective member 9 may preferably be approximately 150 µm.

As for other point, as the method for forming the surface-side protective member 9 may be mentioned, for example, a potting method, a spin coat method, a method using a squeegee, a method using a spray, etc.

Figure 8:
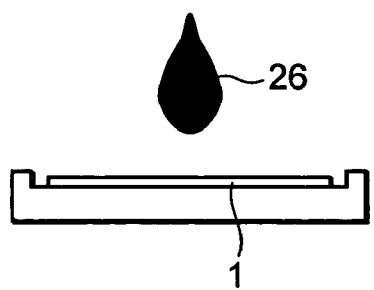
FIG. 8 is a view showing a forming method using potting.

The potting method is a method for dropping a gel-like or liquid resin 26 onto the surface of a semiconductor wafer 1, and cooling and curing the resin 26 to thereby form a surface-side protective member, as shown in FIG. 8.

The spin coat method is a method for dropping a gel-like or liquid resin onto the center of the surface of a semiconductor wafer 1, rotating the semiconductor wafer 1 at high speed to diffuse the gel-like or liquid resin over the surface of the semiconductor wafer 1 by centrifugal acceleration, and thereafter cooling and curing the resin to thereby form a surface-side protective member.

Figure 9A:
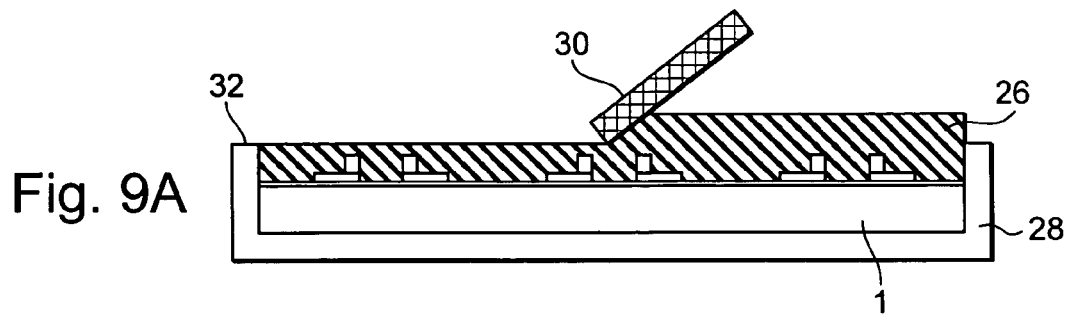
FIG. 9 is a view showing a method using a squeegee in a [process step 1-2] and a [process step 1-4]

The method using the squeegee is a method for discharging a gel-like or liquid resin 26 onto the surface of a semiconductor wafer 1 mounted in a die 28, spreading the resin 26 by using a squeegee 30 corresponding to a flat plate (spatula)-like tool made up of silicon or a metal, and cooling and curing the resin 26 to thereby form a surface-side protective member, as shown in FIGS. 9(A) and (C). And space having a desired breadth is defined between a die sidewall upper portion 32 and the semiconductor wafer 1, whereby a surface-side protective member 9 having a desired thickness can be formed on the surface of the semiconductor wafer 1. Incidentally, FIG. 9(A) is a sectional view for describing the method, and FIG. 9(C) is a plan view therefor, respectively.

The method using the spray is a method for spraying a liquid resin onto the surface of a semiconductor wafer 1 by means of a spray and thereafter solidifying the resin.

Figure 2C:
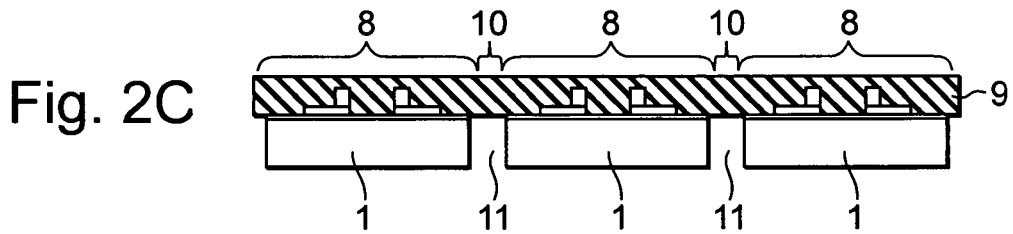

[Process Step 1-3] Trench Forming Step:

Next, as shown in FIGS. 2(C) and 3, the semiconductor wafer 1 corresponding to each boundary region 10 is removed, and trenches 11 for exposing the surface-side protective member 9 are formed (see FIG. 1). The trenches 11 are formed by spin dicing using a dicing blade thicker than a dicing blade employed in a [process step 1-6] to be described later. The width of each trench 11 may preferably be approximately 200 µm or more. To this end, the dicing blade may preferably have a thickness of about 160 µm or more. Since the dicing blade thicker than the dicing blade used when the semiconductor wafer is normally divided into pieces, is used here, stress is further applied to the semiconductor wafer 1 when the dicing blade is brought into contact with the semiconductor wafer 1. Therefore, trenches 11 each having a desired depth are normally formed by performing the operation of moving the dicing blade from the end of the semiconductor wafer 1 to its opposite end only once. However, the trenches 11 each having the desired depth may preferably be formed by performing plural times, the operation of moving the dicing blade from the end of the semiconductor wafer 1 to its opposite end as in the case where, for example, trenches 11 each having a depth equal to one-half of a desired depth are formed in the first operation and the trenches 11 each having the desired depth are formed in the second operation. This is because the trenches 11 can be formed without applying more stress on the semiconductor wafer 1, and the possibility that chipping will occur upon the formation of the trenches 11 can be further reduced. Incidentally, even though the chipping occurs upon the formation of the trenches 11, the occurrence of the chipping can be prevented by charging a back-side protective member 13 into the trenches 11 in a back-side protective member forming step [process step 1-4] to be described later.

In addition to above, the trenches 11 can be formed even by laser dicing or etching.

The laser dicing is method for cutting by melting the semiconductor wafer 1 with laser in place of the blade. The trenches 11 can be formed without applying mechanical stress on the semiconductor wafer than by spin dicing.

In the case of trench formation by etching, regions other than trench forming regions are etched with being masked, thereby making it possible to form the trenches 11. Even in the case of the trench formation by etching, the trenches 11 can be formed without applying mechanical stress on the semiconductor wafer 1 than by spin dicing.

Figure 2D:
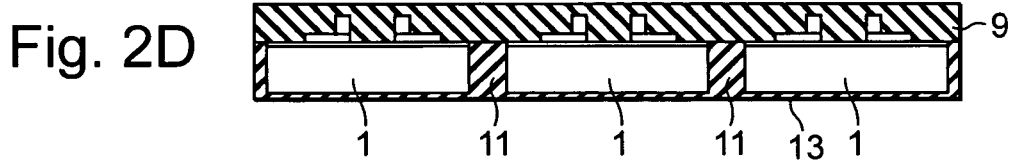

[Process Step 1-4] Back-Side Protective Member Forming Step:

Next, as shown in FIG. 2(D), a back-side protective member 13 is formed with which the trenches 11 are charged and which covers the back of the semiconductor wafer 1, is formed. As a material for the back-side protective member 13, may be mentioned resins such as polyimide, epoxy, polybenzoxazole (PBO), benzocyclobutene (BCB), etc. Then, the back-side protective member 13 is formed as shown in FIG. 7. That is, a solid and resinous tablet 24 is placed on the back of the semiconductor wafer 1 mounted on a heated lower die 20 (see FIG. 7(A)). A heated upper die 22 is lowered (see FIG. 7(B)) to make contact with the tablet 24, thereby press-spreading the tablet over the back of the semiconductor wafer 1 while melting the tablet with heat in gel or liquid form (see FIG. 7(C)). The tablet is further press-spread substantially over the entire back of the semiconductor wafer 1 (see FIG. 7(D)). Then, the resin is cooled and solidified, whereby the back-side protective member 13 can be formed.

In regard to other point, as the method for forming the back-side protective member 13 may be mentioned, for example, a potting method, a spin coat method, a method using a squeegee, a method using a spray, etc.

The potting method is a method for dropping a gel-like or liquid resin 26 onto the surface of a semiconductor wafer 1, and cooling and curing the resin 26 to thereby form a back-side protective member, as shown in FIG. 8.

The spin coat method is a method for dropping a gel-like or liquid resin onto the center of the back of a semiconductor wafer 1, rotating the semiconductor wafer 1 at high speed to diffuse the gel-like or liquid resin over the back surface of the semiconductor wafer 1 by centrifugal acceleration, and thereafter cooling and curing the resin to thereby form a back-side protective member.

Figure 9B:
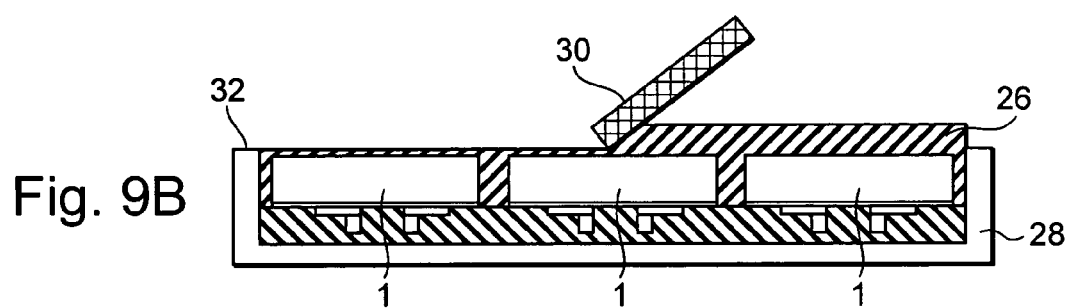
Figure 9C:
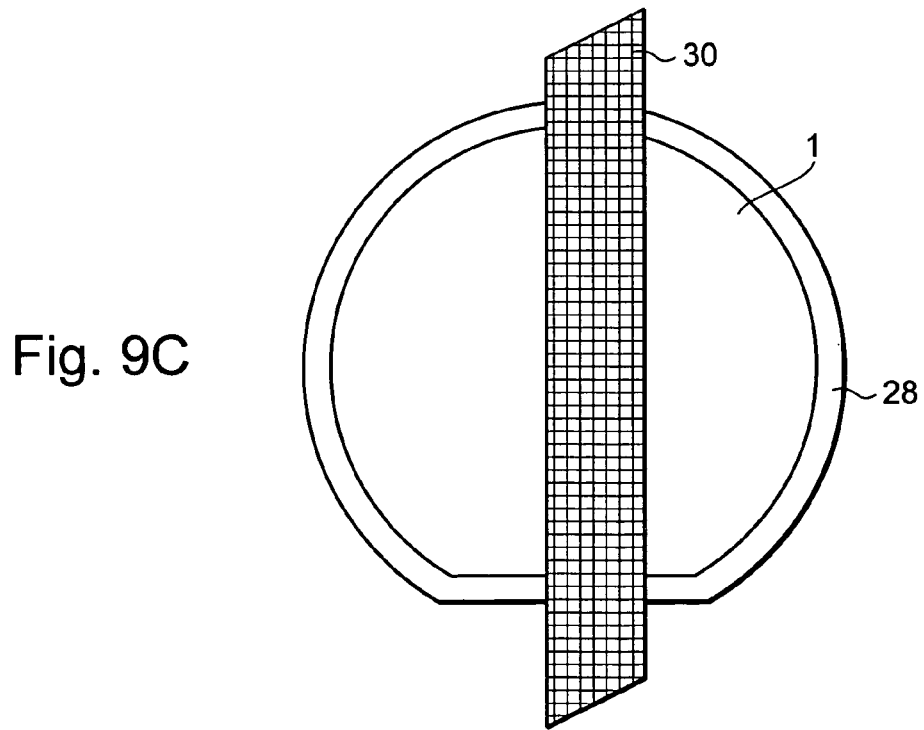

The method using the squeegee is a method for discharging a gel-like or liquid resin 26 onto the back of a semiconductor wafer 1 mounted in a die 28, spreading the resin 26 by using a squeegee 30 corresponding to a flat plate (spatula)-like tool made up of silicon or a metal, and cooling and curing the resin 26 to thereby form a back-side protective member, as shown in FIGS. 9(B) and (C). And space having a desired breadth is defined between a die sidewall upper portion 32 and the semiconductor wafer 1, whereby a back-side protective member 13 having a desired thickness can be formed on the back surface of the semiconductor wafer 1. Incidentally, FIG. 9(B) is a sectional view for describing the method, and FIG. 9(C) is a plan view therefor, respectively.

The method using the spray is a method for spraying a liquid resin onto the back of a semiconductor wafer 1 by means of a spray and thereafter solidifying the resin.

Incidentally, the trenches 11 may substantially be charged with the back-side protective member 13. For example, air bubbles may be left within the back-side protective member 13 in the trenches 11.

Figure 2E:
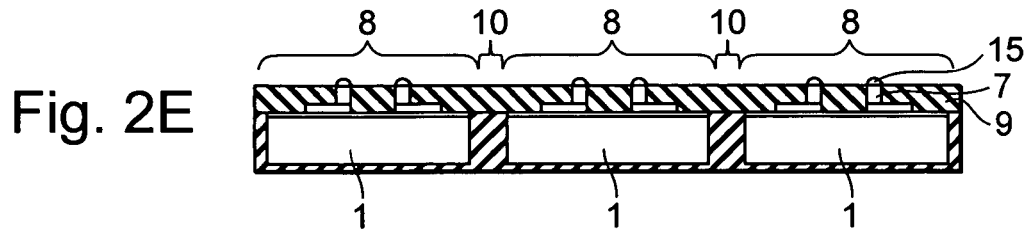

[Process Step 1-5] Post Exposing Step:

Next, as shown in FIG. 2(E), the surface-side protective member 9 is polished from the surface side of the semiconductor wafer 1 to expose the surfaces of the posts 7, whereby solder balls 15 are formed on their corresponding posts 7 by solder paste printing. As a result, the thickness of the surface-side protective member 9 is set to approximately 90 µm.

Incidentally, the present step can be carried out at an arbitrary point in time subsequent to the formation of the surface-side protective member 9. That is, the present step may be performed after the formation of the surface-side protective member 9 and before the formation of the trenches 11 (between [process step 1-2] and ([process step 1-3]). As an alternative to it, the present step may be carried out after the formation of the trenches 11 and before the formation of the back-side protective member 13 (between [process step 1-3] and [process step 1-4]). Alternatively, the present step may be done after the semiconductor wafer 1 has been divided into pieces (after [process step 1-6]).

Figure 2F:
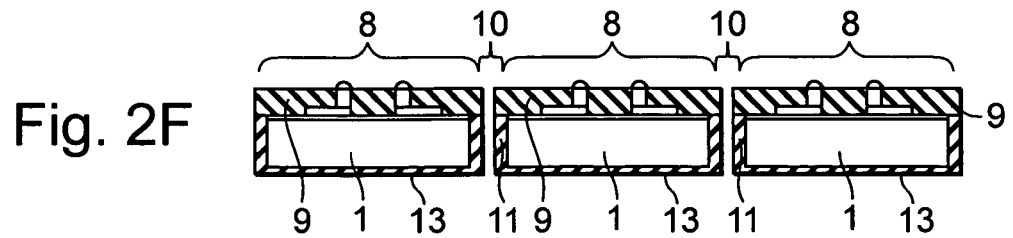
Figure 10:
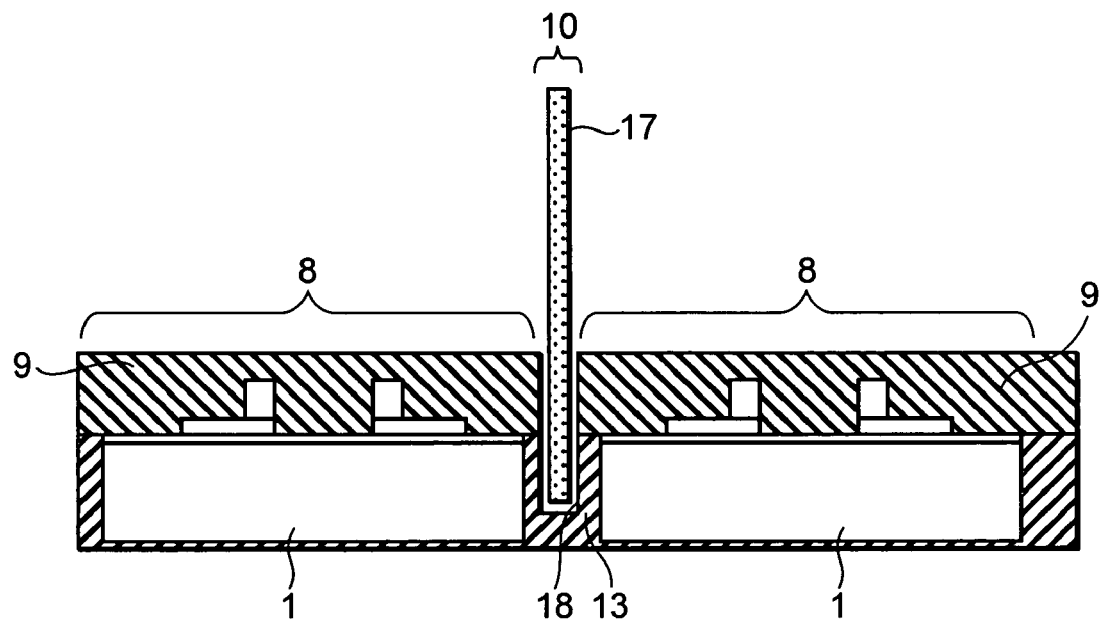
FIG. 10 is an enlarged view of a sectional view showing a dividing process step.

[Process Step 1-6] Dividing Step:

Next, as shown in FIG. 2(F) and FIG. 10, the semiconductor wafer 1 is divided at the boundary regions 10 with widths thinner than the widths of the trenches 11 in such a manner that the surface-side protective member 9 and the back-side protective member 13 charged into the trenches 11 are left in cut cross-sections. That is, the semiconductor wafer is divided along the boundary regions 10 by spin dicing using a dicing blade 17 thinner than the dicing blade used in the [process step 1-3] in such a manner that the surface-side protective member 9 and the back-side protective member 13 are left in the cut cross-sections. Since the width of each boundary region 10 is 60 µm in the present embodiment, the thickness of the dicing blade may preferably be approximately 20 µm. Incidentally, as to the direction in which the semiconductor wafer is cut, the semiconductor wafer may be cut from the surface side thereof to the back side thereof. In reverse, it may be cut from the back side of the semiconductor wafer 1 to the surface side thereof.

As to other point, the semiconductor wafer can be divided even by laser dicing or etching. Even in the case of these, the semiconductor wafer 1 is divided with widths thinner than the widths of the trenches 11. The laser dicing or etching enables division of the semiconductor wafer 1 without applying any stress on the semiconductor wafer 1, than by the spin dicing in a manner similar to the formation of the trenches 11.

A semiconductor device is completed in this way (see FIG. 4).

According to the semiconductor device manufacturing method of the first embodiment, since the trenches 11 are charged with the back-side protective member 13, there is no portion where the dicing blade directly contacts the semiconductor wafer 1 in the dividing step. Hence, it is firstly possible to reduce a possibility that the chipping at the division of the semiconductor wafer 1 will occur. That is, the present method is capable of effectively preventing the chipping as compared with the methods of the patent documents 1 and 2 in each of which the dicing blade is brought into slight contact with the semiconductor wafer upon its division.

Secondly, since the semiconductor substrate is covered with the surface-side protective member 9 and the back-side protective member 13 over the entire side, front and back surfaces thereof and not exposed, except for the portions where the solder balls are formed, each individualized semiconductor device is capable of reducing a possibility that the chipping will occur after completion of the semiconductor device. That is, the present method can effectively prevent or reduce the chipping as compared with the method of the patent document 1 in which the side faces and back of the semiconductor substrate are exposed.

It is thirdly possible to reduce the number of process steps as compared with the methods of the patent documents 3 and 4 each having the effect of reducing both possibilities that the chipping at the division and the chipping subsequent to the completion of each semiconductor device will occur, in a manner similar to the present invention. That is, the method of the patent document 3 needs the step of grinding the trenches formed from the surface side from the back side (refer to FIG. 4(a) of the patent document 3). The method of the patent document 4 also needs the step of grinding the trenches formed from the surface side from the back side in like manner (refer to FIG. 3(6) of the patent document 4).

Second Preferred Embodiment

A method for manufacturing a semiconductor device, according to a second embodiment of the present invention will be explained with reference to FIG. 1, FIG. 5 and FIG. 6. FIG. 1 is a plan view of a semiconductor wafer employed in the present embodiment. FIGS. 5(A) through 5(F) are sections taken every manufacturing process steps in the semiconductor device manufacturing method according to the second embodiment and are sectional views taken along line A-A' of FIG. 1. FIG. 6 is a sectional and bottom view of a semiconductor device manufactured by such a manufacturing method.

Figure 5A:
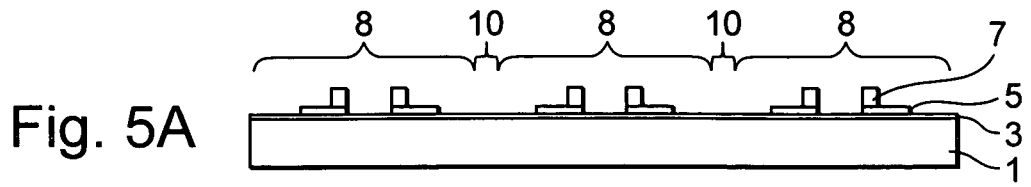
FIG. 5 illustrates sectional views taken every process steps for describing a manufacturing method according to a second embodiment.

[Process Step 2-1] Protruded Electrode Forming Step:

As shown in FIGS. 1 and 5(A), posts 7 (protruded electrodes) are first respectively formed on a plurality of chip areas 8 of a semiconductor wafer 1 having the plurality of chip areas 8 and boundary regions 10 formed among the chip areas 8 both of which are provided in the surface of the semiconductor wafer 1. That is, the semiconductor wafer 1 having the plurality of chip areas 8 and the boundary regions 10 on its surface is prepared (see FIG. 1), and semiconductor integrated circuits (not shown) are formed in the individual chip areas 8 respectively. The surface of the semiconductor wafer 1 including the semiconductor integrated circuits is covered with an insulating film 3. Redistribution traces 5 electrically connected to the individual semiconductor integrated circuits are formed on the insulating film 3, and the posts 7 are respectively formed on the redistribution traces 5 (see FIG. 5(A)).

Here, for example, a silicon oxide film ($SiO_2$), Phospho-Silicate-Glass (PSG), a silicon nitride film ($Si_3N_4$), and a polyimide resin (PI) can be used as the insulating film 3. Aluminum can be used as the redistribution traces 5, and copper can be used as the posts 7.

The thickness of the semiconductor wafer 1 is set to 310 μm, one side of each individual chip area 8 is set to 5 mm, and the width of each boundary region 10 is set to 60 μm.

Figure 5B:
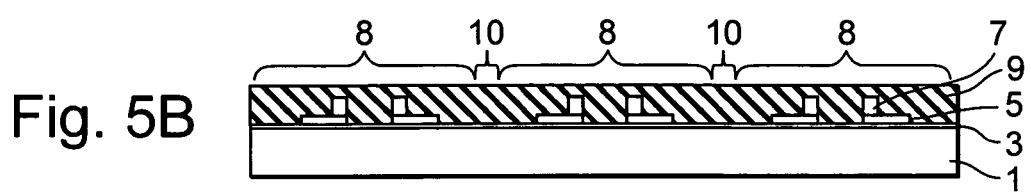

[Process Step 2-2] Surface-Side Protective Member Forming Step:

Next, as shown in FIG. 5(B), a surface-side protective member 9 is formed so as to cover the surface of the semiconductor wafer 1 and the posts 7. That is, the insulating film 3 for covering the surface of the semiconductor wafer 1, the redistribution traces 5 and the posts 7 are covered with the surface-side protective member 9.

Resins such as polyimide, epoxy, polybenzoxazole (PBO), benzocyclobutene (BCB), etc. can be used as a material for the surface-side protective member 9.

The surface-side protective member 9 is formed as shown in FIG. 7. That is, a solid and resinous tablet 24 is placed on the surface of the semiconductor wafer 1 mounted on a heated lower die 20 (see FIG. 7(A)). A heated upper die 22 is lowered (see FIG. 7(B)) to make contact with the tablet 24, thereby press-spreading the tablet over the surface of the semiconductor wafer 1 while melting the tablet with heat in gel or liquid form (see FIG. 7(C)). The tablet is further press-spread substantially over the entire surface of the semiconductor wafer 1 (see FIG. 7(D)). Then, the tablet is cooled and solidified, whereby the surface-side protective member 9 can be formed. The thickness of the surface-side protective member 9 may preferably be approximately 150 μm.

As for other point, as the method for forming the surface-side protective member 9 may be mentioned, for example, a potting method, a spin coat method, a method using a squeegee, a method using a spray, etc.

The potting method is a method for dropping a gel-like or liquid resin 26 onto the surface of a semiconductor wafer 1 and cooling and curing the resin 26 to thereby form a surface-side protective member, as shown in FIG. 8.

The spin coat method is a method for dropping a gel-like or liquid resin onto the center of the surface of a semiconductor wafer 1, rotating the semiconductor wafer 1 at high speed to diffuse the gel-like or liquid resin over the surface of the semiconductor wafer 1 by centrifugal acceleration, and thereafter cooling and curing the resin to thereby form a surface-side protective member.

Figure 11A:
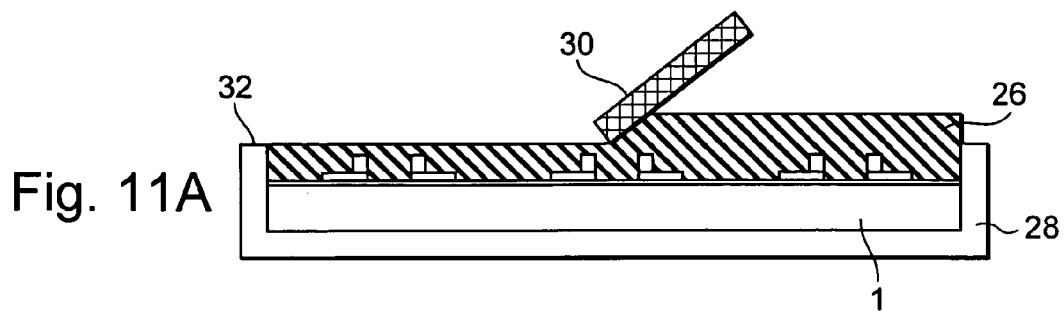
FIG. 11 is a view showing a method using a squeegee in a [process step 2-2] and a [process step 2-4].
Figure 11B:
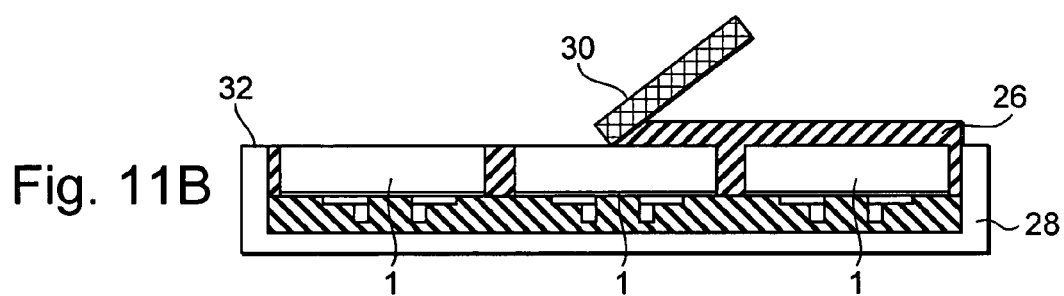
Figure 11C:
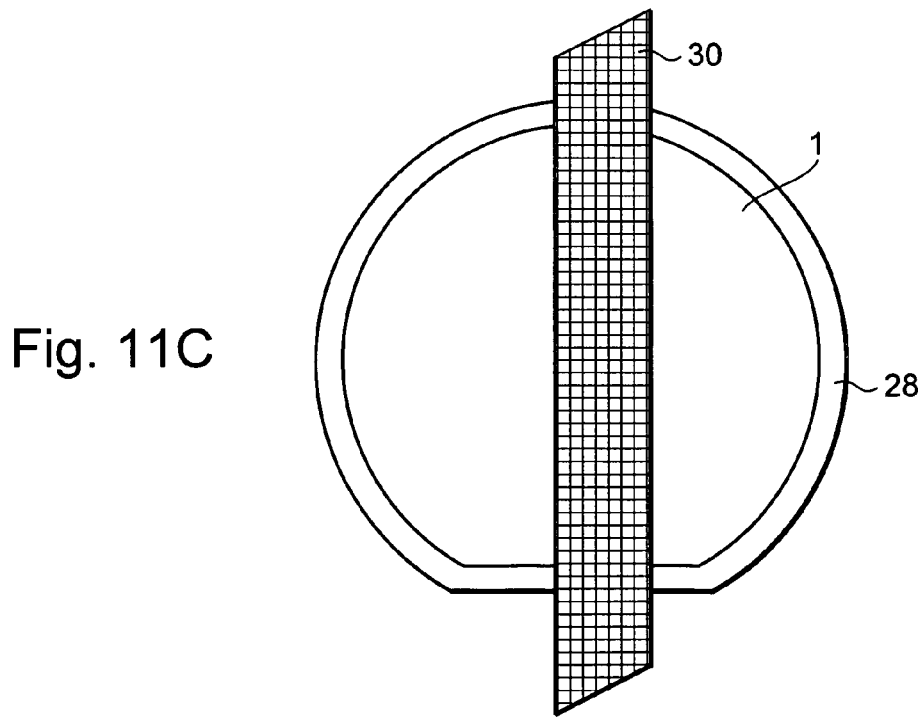

The method using the squeegee is a method for discharging a gel-like or liquid resin 26 onto the surface of a semiconductor wafer 1 mounted in a die 28, spreading the resin 26 by using a squeegee 30 corresponding to a flat plate (spatula)-like tool made up of silicon or a metal, and cooling and curing the resin 26 to thereby form a surface-side protective member, as shown in FIGS. 11(A) and (C). And space having a desired breadth is defined between a die sidewall upper portion 32 and the semiconductor wafer 1, whereby a surface-side protective member 9 having a desired thickness can be formed on the surface of the semiconductor wafer 1. Incidentally, FIG. 11(A) is a sectional view for describing the method, and FIG. 11(C) is a plan view therefor, respectively.

The method using the spray is a method for spraying a liquid resin onto the surface of a semiconductor wafer 1 by means of a spray and thereafter solidifying the resin.

Figure 5C:
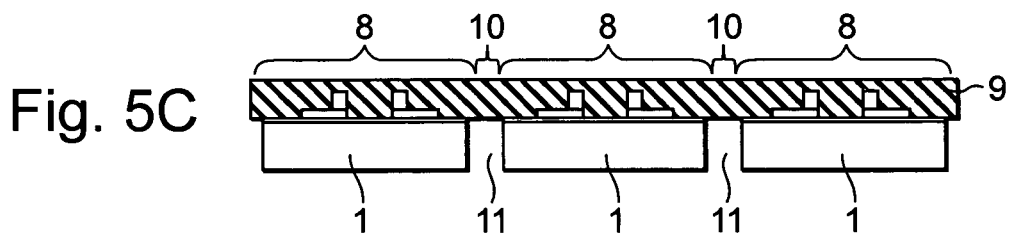

[Process Step 2-3] Trench Forming Step:

Next, as shown in FIG. 5(C) and FIG. 3, the semiconductor wafer 1 corresponding to each boundary region 10 is removed, and trenches 11 for exposing the surface-side protective member 9 are formed (see FIG. 1). The trenches 11 are formed by spin dicing using a dicing blade thicker than a dicing blade employed in a [process step 2-6] to be described later. The width of each trench 11 may preferably be approximately 200 μm or more. To this end, the dicing blade may preferably have a thickness of about 160 μm or more. Since the dicing blade thicker than the dicing blade used when the semiconductor wafer is normally divided into pieces, is used here, stress is further applied to the semiconductor wafer 1 when the dicing blade is brought into contact with the semiconductor wafer 1. Therefore, trenches 11 each having a desired depth are normally formed by performing the operation of moving the dicing blade from the end of the semiconductor wafer 1 to its opposite end only once. However, the trenches 11 each having the desired depth may preferably be formed by performing plural times, the operation of moving the dicing blade from the end of the semiconductor wafer 1 to its opposite end as in the case where, for example, trenches 11 each having a depth equal to one-half of a desired depth are formed in the first operation and the trenches 11 each having the desired depth are formed in the second operation. This is because the trenches 11 can be formed without applying more stress on the semiconductor wafer 1, and the possibility that chipping will occur upon the formation of the trenches 11 can be further reduced. Incidentally, even though the chipping occurs upon the formation of the trenches 11, the occurrence of the chipping can be prevented by charging a back-side protective member 13 into the trenches 11 in a back-side protective member forming step [process step 2-4] to be described later.

In addition to above, the trenches 11 can be formed even by laser dicing or etching.

The laser dicing is method for cutting by melting the semiconductor wafer 1 with laser in place of the blade. The trenches 11 can be formed without applying mechanical stress on the semiconductor wafer than by spin dicing.

In the case of trench formation by etching, regions other than trench forming regions are etched with being masked, thereby making it possible to form the trenches 11. Even in the case of the trench formation by etching, the trenches 11 can be formed without applying mechanical stress on the semiconductor wafer 1 than by spin dicing.

Figure 5D:
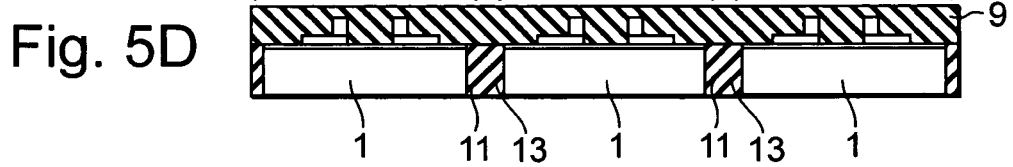

[Process Step 2-4] Back-Side Protective Member Forming Step:

Next, as shown in FIG. 5(D), a back-side protective member 13 is formed with which the trenches 11 are charged and which covers the back of the semiconductor wafer 1, is formed. As a material for the back-side protective member 13, may be mentioned resins such as polyimide, epoxy, polybenzoxazole (PBO), benzocyclobutene (BCB), etc. Then, the back-side protective member 13 can be formed by the method using the squeegee. That is, as shown in FIGS. 11(B) and 11(C), a gel-like or resinous resin 26 is discharged onto the back of a semiconductor wafer 1 mounted in a die 28 and applied thereto and spread thereover so as to be scraped by using a squeegee 30 corresponding to a flat plate (spatula)-like tool made up of silicon or a metal, thereby making it possible to form such a back-side protective member 13 that the trenches 11 are charged therewith but the back of the semiconductor wafer 1 is not covered therewith. As distinct from the first embodiment, no space is defined between the die sidewall upper portion 32 and the semiconductor wafer 1. It is thus possible to avoid the formation of the back-side protective member 13 on the back of the semiconductor wafer 1. Incidentally, FIG. 11(B) is a sectional view for describing such a method, and FIG. 11(C) is a plan view therefor, respectively.

Incidentally, the trenches 11 may substantially be charged with the back-side protective member 13. For instance, air bubbles may be left within the back-side protective member 13 in the trenches 11.

Figure 5E:
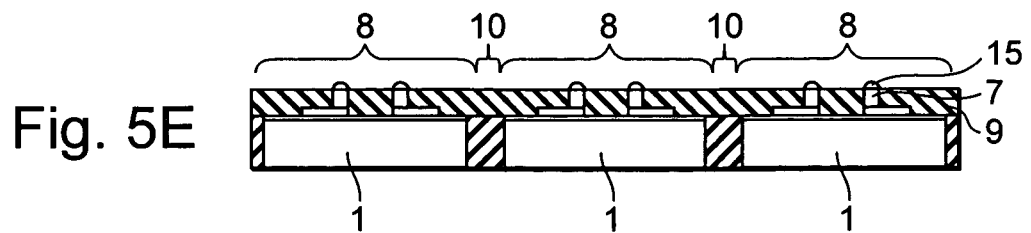

[Process Step 2-5] Post Exposing Step:

Next, as shown in FIG. 5(E), the surface-side protective member 9 is ground from the surface side of the semiconductor wafer 1 to expose the surfaces of the posts 7, whereby solder balls 15 are formed on their corresponding posts 7 by solder paste printing. As a result, the thickness of the surface-side protective member 9 is set to approximately 90 μm.

Incidentally, the present step can be carried out at an arbitrary point in time subsequent to the formation of the surface-side protective member 9. That is, the present step may be performed after the formation of the surface-side protective member 9 and before the formation of the trenches 11 (between [process step 2-2] and [process step 2-3]). As an alternative to it, the present step may be carried out after the formation of the trenches 11 and before the formation of the back-side protective member 13 (between [process step 2-3] and [process step 2-4]). Alternatively, the present step may be done after the semiconductor wafer 1 has been divided into pieces (after [process step 2-6]).

Figure 5F:
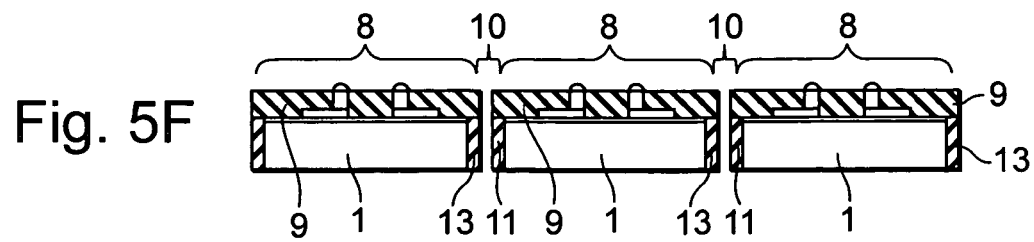

[Process Step 2-6] Dividing Step:

Next, as shown in FIG. 5(F) and FIG. 10, the semiconductor wafer 1 is divided at the boundary regions 10 with widths thinner than the widths of the trenches 11 in such a manner that the surface-side protective member 9 and the back-side protective member 13 charged into the trenches 11 are left in cut cross-sections. That is, the semiconductor wafer is divided along the boundary regions 10 by spin dicing using a dicing blade 17 thinner than the dicing blade used in the [process step 2-3] in such a manner that the surface-side protective member 9 and the back-side protective member 13 are left in the cut cross-sections. Since the width of each boundary region 10 is 60 μm in the present embodiment, the thickness of the dicing blade may preferably be approximately 20 μm. Incidentally, as to the direction in which the semiconductor wafer is cut, the semiconductor wafer may be cut from the surface side thereof to the back side thereof. In reverse, it may be cut from the back side of the semiconductor wafer 1 to the surface side thereof.

As to other point, the semiconductor wafer can be divided even by laser dicing or etching. Even in the case of these, the semiconductor wafer 1 is divided with widths thinner than the widths of the trenches 11. The laser dicing or etching enables division of the semiconductor wafer 1 without applying any stress on the semiconductor wafer 1, than by the spin dicing in a manner similar to the formation of the trenches 11.

Figure 6A:
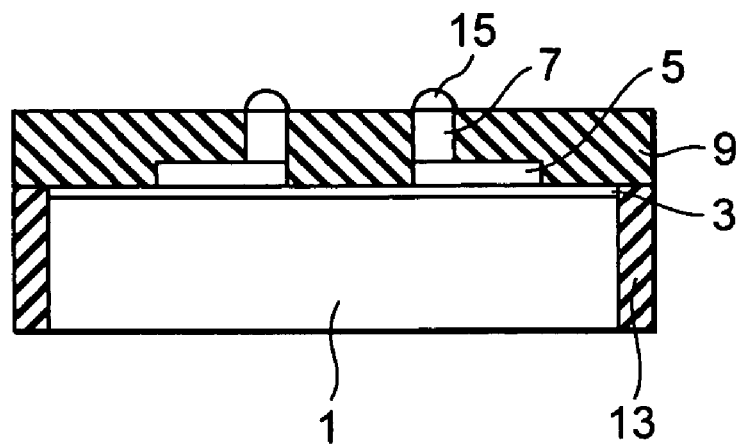
FIG. 6 is a sectional view of a semiconductor device manufactured by the manufacturing method according to the second embodiment.
Figure 6B:
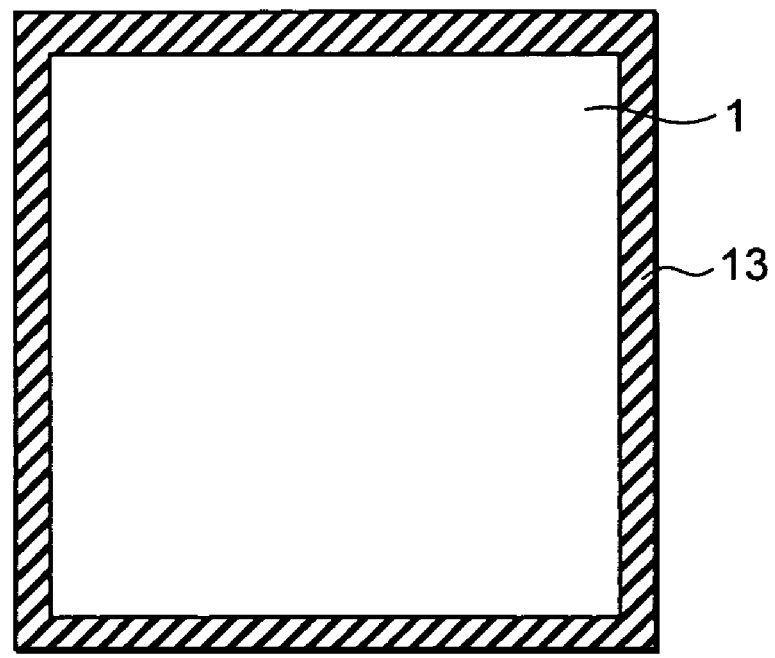
Figure 7A:
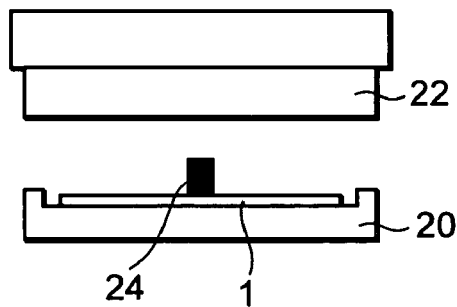
FIG. 7 is a view showing a forming method using a tablet.
Figure 7B:
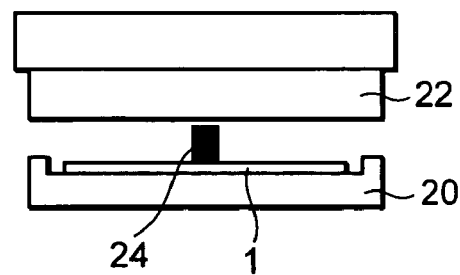
Figure 7C:
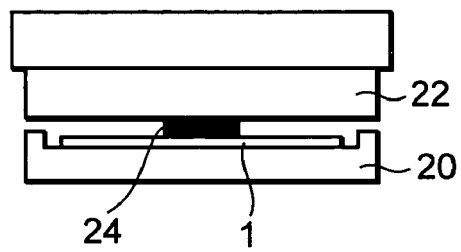
Figure 7D:
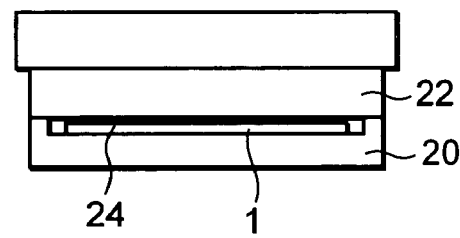

A semiconductor device is completed in this way (see FIG. 6). FIG. 6(A) is a sectional view of the completed semiconductor device, and FIG. 6(B) is a bottom view as seen from the back of the completed semiconductor device, respectively.

According to the semiconductor device manufacturing method of the second embodiment, since the trenches 11 are charged with the back-side protective member 13 in a manner similar to the semiconductor device manufacturing method of the first embodiment, there is no portion where the dicing blade directly contacts the semiconductor wafer 1 in the dividing step. Hence, it is firstly possible to reduce a possibility that the chipping at the division of the semiconductor wafer 1 will occur. That is, the present method is capable of effectively preventing the chipping as compared with the methods of the patent documents 1 and 2 in each of which the dicing blade is brought into slight contact with the semiconductor wafer upon its division.

Secondly, since the side and front faces of the semiconductor substrate are covered with the surface-side protective member 9 and the back-side protective member 13 although the back thereof is exposed, each individualized semiconductor device is capable of reducing a possibility that the chipping will occur after completion of the semiconductor device. This is because the outer peripheral portion of the back where the chipping is most like to occur, is covered with the resin. Thus, the present method can effectively prevent or reduce the chipping as compared with the method of the patent document 1 in which the side faces and back of the semiconductor substrate are exposed.

It is thirdly possible to reduce the number of process steps as compared with the methods of the patent documents 3 and 4 each having the effect of reducing both possibilities that the chipping at the division and the chipping subsequent to the completion of each semiconductor device will occur, in a manner similar to the present invention. That is, the method of the patent document 3 needs the step of grinding the trenches formed from the surface side from the back side (refer to FIG. 4(a) of the patent document 3). The method of the patent document 4 also needs the step of grinding the trenches formed from the surface side from the back side in like manner (refer to FIG. 3(6) of the patent document 4).

Fourthly, since the back-side protective film 13 is not formed on the back of the semiconductor wafer 1, the semiconductor device thinner than the semiconductor device manufactured by the manufacturing method according to the first embodiment can be formed. That is, while the semiconductor device is made thin in a manner similar to the semiconductor device manufactured according to each of the methods of the patent documents 1 and 3 wherein no back-side protective film is formed at the back of the semiconductor device, the possibility that the chipping at the division will occur can be reduced as compared with the method of the patent document 1, and the number of process steps can be cut down as compared with the method of the patent document 3.

Fifthly, the back of the semiconductor wafer 1 is exposed and only the trenches 11 are charged with the back-side protective film 13. It is therefore easy to recognize the boundary regions 10 where the semiconductor wafer is divided from the back thereof.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor device, comprising:

forming conductive traces and posts on a plurality of chip areas of a semiconductor wafer having the plurality of chip areas and boundary regions formed among the chip areas, the chip areas and the boundary regions both being provided in a surface of the semiconductor wafer;

forming a surface-side protective member so as to cover the surface of the semiconductor wafer and upper and side surfaces of the conductive traces and posts;

removing the semiconductor wafer corresponding to the boundary regions and forming trenches which expose the surface-side protective member;

forming a back-side protective member with which the trenches are filled and which covers a back of the semiconductor wafer;

solidifying the back-side protective member by cooling while the surface-side protective member covers the surface of the semiconductor wafer and the upper and side surfaces of the conductive traces and posts; and dividing the semiconductor wafer by cutting at the boundary regions, the cuts having width thinner than a width of the trenches so that the surface-side protective member and the back-side protective member charged into the trenches are left at cut sections of the semiconductor wafer.

2. The method according to claim 1, wherein the trenches are formed by laser dicing or etching.

3. A method for manufacturing a semiconductor device, comprising:

forming conductive traces and posts on a plurality of chip areas of a semiconductor wafer having the plurality of chip areas and boundary regions formed among the chip areas, the chip areas and the boundary regions both being provided in a surface of the semiconductor wafer;

forming a surface-side protective member so as to cover the surface of the semiconductor wafer and upper and side surfaces of the conductive traces and posts;

removing the semiconductor wafer corresponding to the boundary regions and forming trenches which expose the surface-side protective member;

forming a back-side protective member with which the trenches are filled and so that a back surface of the semiconductor wafer is exposed;

solidifying the back-side protective member by cooling while the surface-side protective member covers the surface of the semiconductor wafer and the upper and side surfaces of the conductive traces and posts; and dividing the semiconductor wafer by cutting at the boundary regions, the cuts having width thinner than a width of the trenches so that the surface-side protective member and the back-side protective member charged into the trenches are left at cut sections of the semiconductor wafer.

4. The method according to claim 3, wherein the back-side protective member is formed by a squeegee.

5. The method according to claim 3, wherein the trenches are formed by laser dicing or etching.

6. A method of manufacturing a semiconductor device, comprising:

forming redistribution traces and conductive posts in chip areas on a first surface of a semiconductor wafer, the chip areas isolated from each other by boundary areas;

forming a first protective member on the first surface of the semiconductor wafer that also covers upper and side surfaces of both the redistribution traces and the conductive posts;

forming trenches in the semiconductor wafer in a second surface of the semiconductor wafer that is opposite the first surface, the trenches exposing the first protective member;

forming a second protective member that fills the trenches;

solidifying the second protective member by cooling while the first protective member covers the first surface of the semiconductor wafer and the upper and side surfaces of both the redistribution traces and the conductive posts; and cutting the semiconductor wafer along the boundary areas to separate the chip areas from each other and provide individual chips, a width of the cuts being less than a width of the boundary areas so that the first and second protective members remain on side walls of the individual chips.

7. The method of manufacturing a semiconductor device of claim 6, wherein the second protective member also covers the second surface of the semiconductor wafer.

8. The method of manufacturing a semiconductor device of claim 6, wherein the second surface of the semiconductor wafer is exposed from the second protective member.

9. The method of manufacturing a semiconductor device of claim 6, wherein said forming trenches is by spin dicing.

10. The method of manufacturing a semiconductor device of claim 6, wherein said forming trenches is by laser dicing.

11. The method of manufacturing a semiconductor device of claim 6, wherein said forming trenches is by etching.

12. The method of manufacturing a semiconductor device of claim 6, further comprising polishing the first protective member to expose top surfaces of the conductive posts, after said forming a second protective member.

* * * * *